(12) United States Patent
Tanaka et al.

(10) Patent No.: US 6,694,792 B2
(45) Date of Patent: Feb. 24, 2004

(54) SUBSTRATE TREATMENT PROCESS

(75) Inventors: Masatoshi Tanaka, Kyoto (JP); Hirokazu Ohtoshi, Nara (JP); Yasuyoshi Takai, Nara (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/900,010

(22) Filed: Jul. 9, 2001

(65) Prior Publication Data

US 2002/0038665 A1 Apr. 4, 2002

(30) Foreign Application Priority Data

Jul. 11, 2000 (JP) ........................................ 2000-210603

(51) Int. Cl.$^7$ ................................................. B21D 3/12
(52) U.S. Cl. ........................................... 72/183; 72/160
(58) Field of Search .......................... 72/160, 164, 165, 72/183, 205

(56) References Cited

U.S. PATENT DOCUMENTS

| | | | | |
|---|---|---|---|---|
| 3,374,653 A | * | 3/1968 | Zeigler | 72/161 |
| 3,389,591 A | * | 6/1968 | Moline | 72/205 |
| 3,777,532 A | * | 12/1973 | Noe | 72/205 |
| 4,485,125 A | | 11/1984 | Izu et al. | 427/74 |
| 4,651,549 A | * | 3/1987 | Masui | 72/161 |
| 4,788,846 A | * | 12/1988 | Morita et al. | 72/160 |
| 4,819,470 A | * | 4/1989 | Noe et al. | 72/161 |
| 5,161,400 A | * | 11/1992 | Lefor | 72/161 |
| 5,510,151 A | | 4/1996 | Matsuyama et al. | 427/509 |

FOREIGN PATENT DOCUMENTS

| | | |
|---|---|---|
| JP | 3-30419 | 2/1991 |
| JP | 6-184745 | 7/1994 |

* cited by examiner

Primary Examiner—Daniel C. Crane
(74) Attorney, Agent, or Firm—Fitzpatrick, Cella, Harper & Scinto

(57) ABSTRACT

A substrate treatment process includes plural steps of delivering a long substrate with application of tensile force to the substrate, wherein the strength of the tensile force is changed at least between a first delivery step and a second delivery step. This process prevents enlargement of edge waviness of a belt-shaped substrate to stabilize the plasma discharge.

9 Claims, 7 Drawing Sheets

SUBSTRATE TREATMENT PROCESS

BACKGROUND OF THE INVENTION

1. Field of the Invention

The present invention relates to a substrate treatment process which treats a long substrate continuously by a roll-to-roll system, or a like system. In particular, the present invention relates to a substrate treatment process which comprises plural treatment steps in which the substrate is delivered with application of a tensile force thereto. The present invention relates further to a process for forming a photovoltaic element, so-called solar cell.

2. Related Background Art

In recent years, various studies are being made for practical solar power generation by a solar cell. For practical use of the solar cell for power supply, the solar cell should have sufficiently high photoelectric conversion efficiency and high reliability, and should be suitable for mass production.

Solar cells employing amorphous silicon are attracting attention because of possibility of mass-production at a low cost (hereinafter the amorphous silicon is referred to simply as "a-Si"). This is because, in the production of the a-Si solar cell, a deposition film of a semiconductor or the like can be formed from a readily available source gas like a silane by glow discharge decomposition on an inexpensive belt-shaped substrate such as metal sheets or resin sheets. Various methods are disclosed for the process and apparatus for the a-si solar cell.

FIG. 1 is a schematic sectional view of an a-Si solar cell. In FIG. 1, the solar cell is constituted of a substrate 101, back reflection layers 102–103, semiconductor layers 104–106, a transparent electroconductive layer 107, and collecting electrodes 108. Hereinafter the assembly of the parts 101–107 is called a solar cell slab (or simply, a slab).

In a production process of an a-Si solar cell, substrate 101 is a belt-shaped electroconductive substrate of stainless steel or the like wound in a rolled state; back reflection layer 102–103 is constituted of metal layer 102 formed from highly reflective silver (Ag), aluminum (Al), copper (Cu), or the like, and transparent oxide layer 103 having a suitable resistance formed from zinc oxide (ZnO), tin oxide ($SnO_2$), or the like between the metal layer and the semiconductor layer. These layers are formed by means of a roll-to-roll type of continuous sputtering apparatus as disclosed, for example, in Japanese Patent Application Laid-Open No. 6-184745.

As a semiconductor film formation apparatus, a roll-to-roll type of continuous plasma CVD apparatus is disclosed in U.S. Pat. No. 4,485,125. An n-Type semiconductor layer 104 and p-type semiconductor layer 106 can be formed by an RF plasma CVD process (RFPCVD process). An i-Type semiconductor layer 105 can be formed by an RF plasma CVD process, or a microwave plasma CVD process (MWPCVD process) with a roll-to-roll type apparatus disclosed in Japanese Patent Application Laid-Open No. 3-30419. The microwave having a high frequency can give a higher energy density than RF, and is suitable for plasma generation and maintenance thereof at a low pressure. These processes are capable of forming high-quality deposition film by preventing polymerization of active species not to deteriorate the deposition film, and preventing generation of dust of polysilanes or the like in the plasma to improve dramatically the film formation speed.

Transparent electroconductive layer 107 can be formed from an electroconductive material transparent to visible light such as $SnO_2$, $In_2O_3$ and ITO ($In_2O_3+SnO_2$) by a roll-to-roll type of continuous sputtering apparatus.

After deposition of the transparent electroconductive layer, the rolled substrate is cut into slabs in a prescribed size. Thereon, collecting electrodes 108 are formed by soldering the wire of copper, silver, or the like in the solar cell module process line.

In mass production of solar cells by the roll-to-roll system, the belt-shaped substrate is preferably made longer and broader, and is preferably made thinner for lower production cost.

In the belt-shaped electroconductive substrate production process, the broad substrate is slit in the length direction into a prescribed width in a slitter process line to obtain the substrate product for layer formation. This slitting process causes waving at the cut edges of the slitted belt-shaped substrate (hereafter this waving referred to as "edge waviness").

The production of a solar cell by a roll-to-roll system comprises essentially plural treatment steps for cleaning, a back reflection layer formation, a semiconductor layer formation, and so forth. In each of the steps, the belt-shaped substrate is wound off from a roll, delivered, and wound up by another roll. The above steps are generally different in the treatment conditions such as in the length of the delivery path, inclination in the delivery direction, the state of the delivery path (linear, curved, folded, etc.), the atmosphere of the treatment, the substrate temperature, and tensile force applied to the substrate.

In a production process of a solar cell, for example, the substrate is cleaned in a liquid at an atmospheric pressure at a temperature ranging from room temperature to 100° C., and the back reflection layer and the semiconductor layer are formed in a vacuum respectively at a different substrate temperature. The difference in the substrate treatment conditions during the substrate delivery may cause deformation of the substrate: deformation by stress, deformation by heat from a heater or the plasma, deformation by stress in deposition film of the deposition layer or by external stress given by steering mechanism of a roll-to-roll treatment apparatus. Such deformation of the substrate tends to become remarkable with every passage through the treatment steps, which may enlarge the edge waviness.

Although the edge waviness can be reduced during the treatment to some extent by increasing the tensile force in the treatment apparatus, the edge waviness will become enlarged after the treatment.

In the aforementioned roll-to-roll type of continuous plasma CVD apparatus, the occurrence of the edge waviness by the substrate deformation may cause contact of the deformed portion with the aperture-adjusting plate to cause generation of dust and to deteriorate the properties of the formed film, or to cause scratching of the film face to destroy the semiconductor bonding element at the scratched portion. Further, this substrate is delivered so as to serve as a lid of a discharge box. Therefore, the occurrence of the edge waviness of the substrate may cause leakage of plasma from the discharge chamber to render the discharge unstable, or to cause interruption of the discharge, or to impair uniformity of the film properties, which may lower the production yield.

SUMMARY OF THE INVENTION

The present invention intends to provide a substrate treatment process which solves the aforementioned problems, and which is capable of forming continuously a deposition film with a uniform property and uniform thickness with stable discharge at a high production yield.

The substrate treatment process of the present invention is constituted as shown in the items (1)–(7) below to solve the above problems:

(1) A substrate treatment process comprising plural steps of delivering a long substrate with application of tensile force, wherein the strength of the tensile force is changed at least between a first delivery step and a second delivery step.

(2) The substrate treatment process of the above item (1), wherein the tensile force is less in the first delivery step than in the second delivery step.

(3) The substrate treatment process of the above item (1) or (2), wherein the extensibility of the substrate in the first step is equal to or higher than that in the second step.

(4) The substrate treatment process of any of the above items (1)–(3), wherein the temperature of the substrate in the first step is controlled to be not lower than 40° C.

(5) The substrate treatment process of any of the above items (1)–(4), wherein the tensile force in the first step ranges from 300 to 800 N.

(6) The substrate treatment process of any of the above items (1)–(5), wherein the difference in the tensile strength between the first step and the second step ranges from 50 to 200 N.

(7) The substrate treatment process of any of the above items (1)–(6), wherein the tensile force is applied stepwise (tapered tension) in the first step and/or the second step.

The "delivery step" in the specification of the present invention means a series of steps from the start to the end of the delivery. For example, in the roll-to-roll system, the operation from winding-off of the long substrate from a roll to winding-up of the substrate by another roll is regarded as one delivery step.

DETAILED DESCRIPTION OF THE PREFERRED EMBODIMENTS

In the embodiments of the present invention, the substrate is delivered with application of tensile force controlled in each of the steps by employing the aforementioned constitution. With this constitution, the edge waviness caused by slitting in the belt-shaped electroconductive substrate production process is prevented from enlargement caused by the tensile force, thermal deformation stress given by the heater or the plasma, the deposition film stress, the external stress given by the steering mechanism of the roll-to-roll treatment systems, or the like in the steps of cleaning, formation of deposition films for the back reflection layer, the semiconductor layer, and the transparent electroconductive layer; or new development of edge waviness is prevented; or the adverse effects of the edge waviness is suppressed even if the edge waviness has been caused to some extent.

The suppression of development of the edge waviness or the adverse effects thereof solves the problems of scratching of the film face of the semiconductor layer, unstableness of the discharge caused by plasma leakage, and so forth. Thereby, the production yield can be stabilized and improved.

The present invention is described below more specifically.

Firstly, the formation of the edge waviness of the belt-shaped electroconductive substrate is explained. In production of the belt-shaped electroconductive substrate, the substrate passes through a step of cleaning, and steps successive formation of a back reflection layer, a semiconductor layer, and a transparent electroconductive layer. In the above steps, the belt-shaped electroconductive substrate is subjected to deformation stress: tensile force in formation of deposition layers, thermal deformation stress given by a heater or a plasma, deposition film stress caused by the respective deposition layers, external stress given by the steering mechanism of the roll-to-roll treatment apparatus, and so forth. The edge waviness is enlarged in the respective steps by the deformation stresses.

The process for producing the belt-shaped substrate for the film deposition is explained below. In the production of the belt-shaped electroconductive substrate, the substrate is roll-finished and is finally slit into belts of a prescribed breadth with cutter blades. The cutting with the cutter blade elongates inevitably the cut edge portion to make it wavy. The dimension of the edge waviness of the finished belt-shaped electroconductive substrate ranges usually from 0.1 to 0.7 mm.

The thermal deformation stress is explained by taking a roll-to-roll type of continuous plasma CVD apparatus as a typical example.

Figure 2:
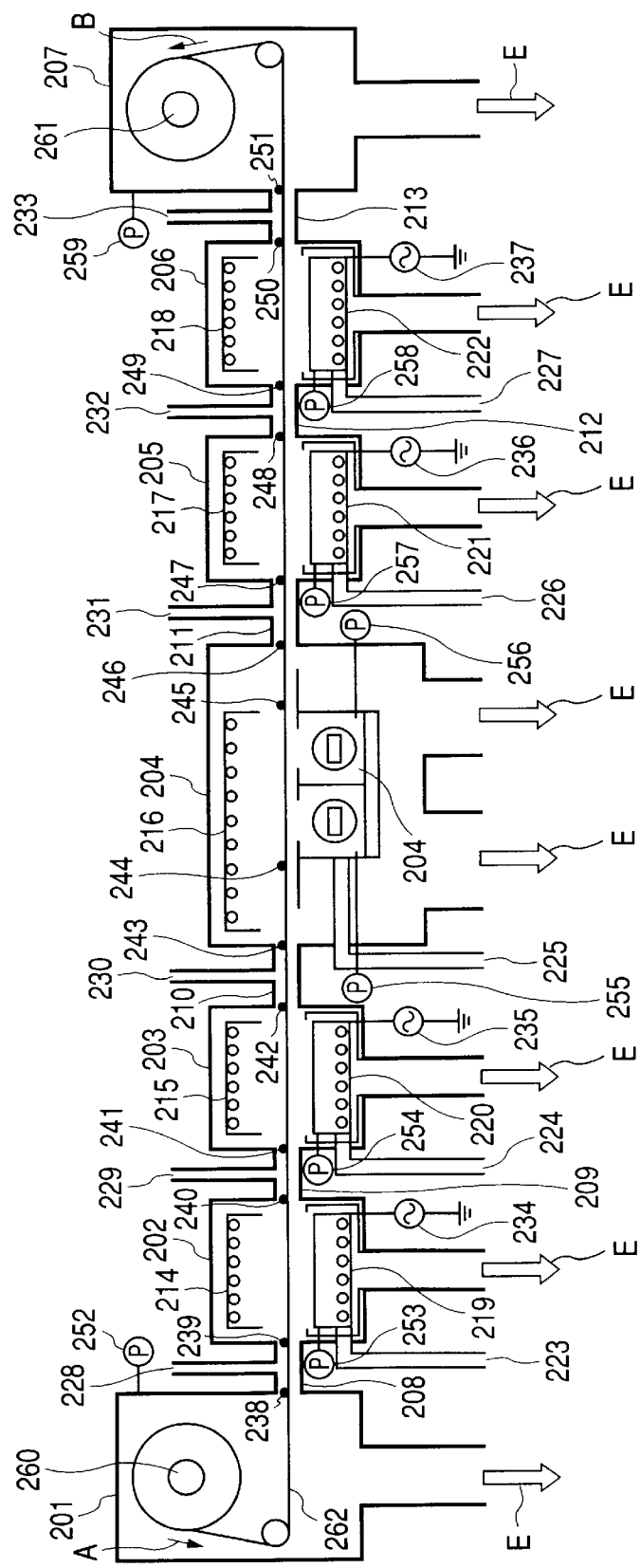
FIG. 2 shows schematically a roll-to-roll system type of continuous plasma CVD apparatus.

FIG. 2 is a schematic diagram of a roll-to-roll type of continuous plasma CVD apparatus. In FIG. 2, the apparatus has members as follows: a substrate-feeding chamber 201, an RF n-type semiconductor layer formation chamber 202, an RF i-type semiconductor layer formation chamber 203, an MW i-type semiconductor layer formation chamber 204, an RF i-type semiconductor layer formation chamber 205, an RF p-type semiconductor layer formation chamber 206, a substrate winding-up chamber 207, gas gates 208–213, lamp heaters 214–218, gas heaters 219–222, gas introduction pipes 223–233, high frequency oscillators 234–237, delivery rollers 238–251, manometers 252–259, a substrate-feeding bobbin 260, a substrate winding-up bobbin 261. The numeral 262 indicates a substrate. Substrate-feeding bobbin 260 rotates in the direction of arrow A. The substrate-winding up bobbin rotates in the direction of arrow B. The gas is evacuated in the direction of arrow E.

In this embodiment, the substrate is a SUS4302D plate of 360 mm in breadth and 0.15 mm in thickness, and is delivered at a delivery speed of 1270 mm/min with application of tensile stress so as not to cause loosening of the substrate. When the substrate has arrived just above the electric discharge space of semiconductor layer formation chamber 202–206, the substrate is heated from the side reverse to the film formation face by lamp heater 214–218, and the film formation face is heated by the plasma to a high temperature. The substrate heated at the discharge space is delivered out and is cooled by passing gas gate 209–213 to a lower temperature. Thereby, the temperature of the substrate changes along the substrate delivery direction. Such a heating and cooling process is repeated in the plural discharge space.

The deformation of the substrate by the temperature change is explained below. Generally, the substrate has a larger breadth in a high temperature region than in a low temperature region owing to thermal expansion. Here, the thermal expansion of the thickness direction is negligible, and the thermal expansion in the delivery direction is also negligible in comparison with length of the delivery path. However, the thermal expansion in the breadth direction is the problem, and is the main cause of the deformation of the substrate.

The thermal expansion of the substrate in the breadth direction is explained below.

Figure 3:
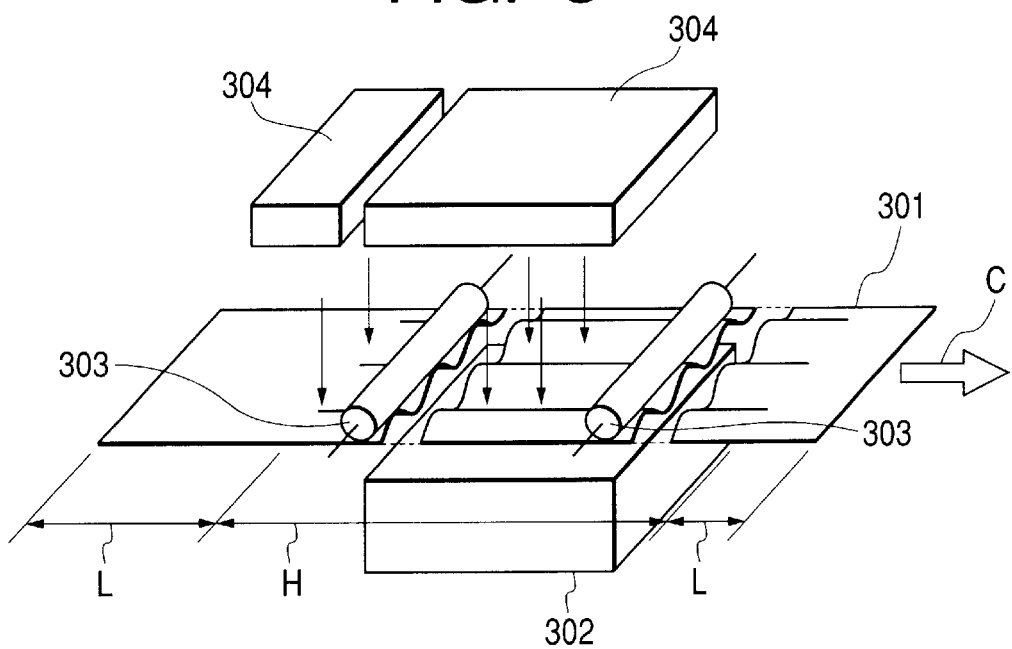
FIG. 3 is a conceptional diagram showing a substrate being delivered continuously through a high temperature region and a low temperature region.

FIG. 3 is a conceptional diagram showing a substrate extending between a high temperature region and a low temperature region. In FIG. 3, the numeral 301 indicates a substrate, 302 a discharge chamber, 303 magnet rollers, and 304 lamp heaters. The symbol C indicates the substrate delivery direction. The symbol H indicates a high temperature region, and the symbol L indicates a low temperature region. In consideration of the local change of the expansion of the substrate, a model is taken in which substrates of different breadths are connected. Since a tensile force is applied in the substrate delivery direction, the apparent breadth is readily changeable. Consequently, in the high temperature range, the thermal expansion exerts compression force to compress the substrate toward the center direction to equalize the breadth at the high temperature region to that at the low temperature range.

Generally, a thin plate is liable to be deformed in a direction perpendicular to the plate face by action of a compression force and a tensile force. The substrate in this embodiment having a thickness of as small as 0.15 mm comes to be deformed perpendicularly to the substrate face.

Figure 4:
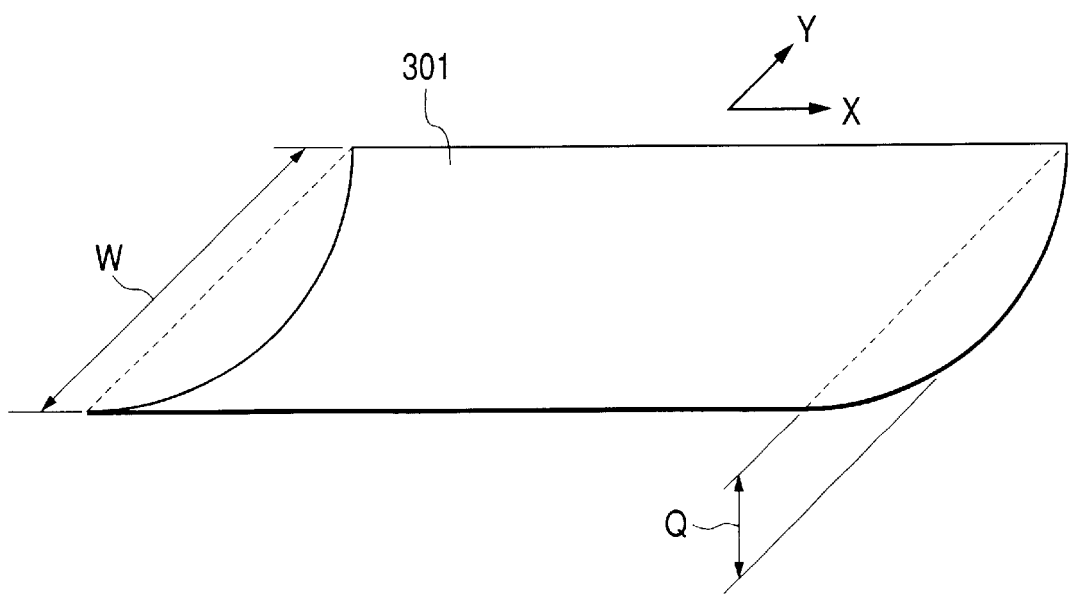
FIG. 4 is a perspective view of a substrate.

FIG. 4 is a perspective view of the substrate. The substrate has a breadth W of 360 mm at room temperature (25° C.). The symbol X indicates the delivery direction, and the symbol Y indicates the breadth direction. The broken line indicates the substrate in a flat state at 25° C.

Table 1 shows calculated thermal expansion of the substrate in the breadth direction, and degree of deformation thereby at typical film-forming temperatures. In Table 1, the deformation Q indicates the distance of the peak of the imaginary arc to be formed by correction of the breadth of the thermally expanded substrate to the unexpanded breadth of 360 mm from the flat plane as shown in FIG. 4.

TABLE 1

| Substrate temperature/ ° C. | Breadth of substrate/ mm | Thermal expansion in breadth/mm | Deformation Q/ mm |
| --- | --- | --- | --- |
| 25 | 360 | 0 | 0 |
| 200 | 360.14 | 0.14 | 4 |
| 300 | 360.21 | 0.21 | 6 |

Next, the stress in the deposition film exerts force to the substrate by successive lamination of the back reflection layer, the semiconductor layer, and the transparent electroconductive layer in the roll-to-roll system treatment.

Deposition of a film on a thin substrate causes curl of the substrate by the deposition film stress. This curling enlarges the waviness of the substrate edges. When the substrate curls with the film inside, the film is exerting a tensile force, whereas when the substrate curls with the film outside, the film is exerting a compressive force.

Figure 5A:
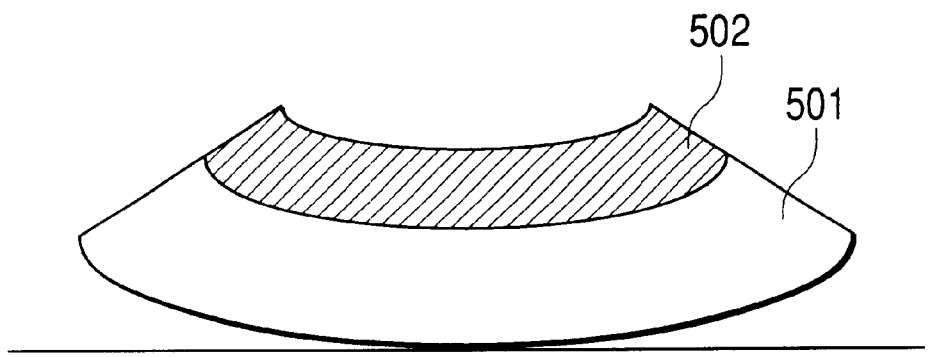
FIGS. 5A and 5B are diagrams showing the definition of the tensile stress and the compressive stress.
Figure 5B:
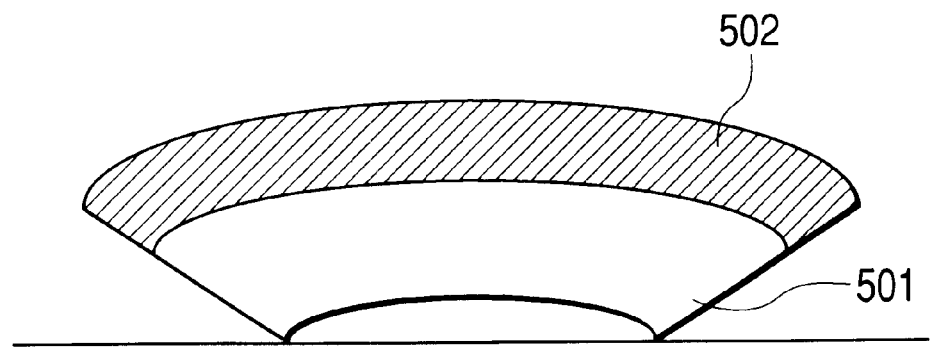

FIGS. 5A and 5B are diagrams showing the definition of the tensile stress and the compressive stress. FIG. 5A shows the action of the tensile stress of the film. FIG. 5B shows the action of the compressive stress of the film. In FIGS. 5A and 5B, the numeral 501 indicates the substrate, and the numeral 502 indicates the deposition film. The tensile stress in the film compresses the substrate portion adjacent to the film, whereas the compressive stress in the film stretches the substrate portion adjacent to the film.

The deposition film stress is explained by classifying the stress into thermal stress and internal stress. The difference in the thermal expansion coefficient between the substrate and the deposition film causes thermal stress owing to the temperature difference of the film formation temperature from room temperature. The greater thermal expansion coefficient of the film causes more contribution of the stress. The higher substrate temperature in film formation increases the effect of the thermal stress.

The internal stress is explained below. The external stress is the stress remaining after the removal of the thermal stress. The internal stress varies depending on the film formation means and the film formation conditions. The internal stress is caused by the strain of the formed film itself.

Figure 1:
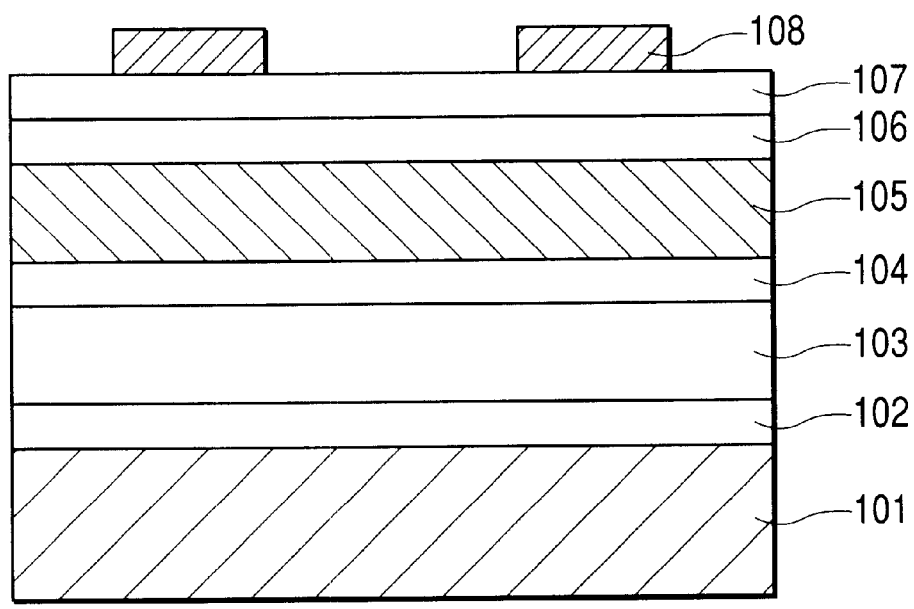
FIG. 1 is a schematic sectional view illustrating a constitution of a single type a-Si solar cell.

Here, the internal stress in the back reflection layer, the first deposition layer, will be explained. In FIG. 1, back reflection layers 102–103 are constituted of metal layer 102 and transparent oxide film 103. Metal layer 102 is formed from highly reflective silver (Ag), aluminum (Al), copper (Cu), or the like. Transparent oxide layer 103 is formed from a material having suitable resistance such as zinc oxide (ZnO), and tin oxide ($SnO_2$) between the metal layer and the semiconductor layer. These films are formed by a roll-to-roll type of continuous sputtering apparatus. The sputtering system may be DC magnetron sputtering which applies a DC voltage to a target member composed of a metal and a metal oxide and striking the target with argon (Ar) ions or the like to form a film with the sputtering particles.

In the film formation by sputtering, the internal stress of the formed sputtering film is considered to be caused by the high-energy Ar atoms or sputtering atoms striking the substrate. The lower sputtering pressure lengthens the mean free path of the particles in the system to increase the ratio of the high-energy Ar atoms and sputter atoms in the particles reaching the substrate, thereby increasing the internal stress.

In this embodiment, an Al film of 200 nm thick as the metal layer, and a ZnO film of 2000 nm thick as the transparent oxide layer are deposited by a roll-to-roll type of continuous DC magnetron sputtering apparatus not shown in the drawing as the back reflection layer on a SUS4302D (stainless steel) plate of 360 mm in breadth and 0.15 mm in thickness. After the film formation, the substrate having the back reflection layer deposited thereon is observed visually at room temperature. The substrate is curled with the film outside as shown FIG. 5B, showing the compressive stress as the internal stress in the film.

Figure 6:
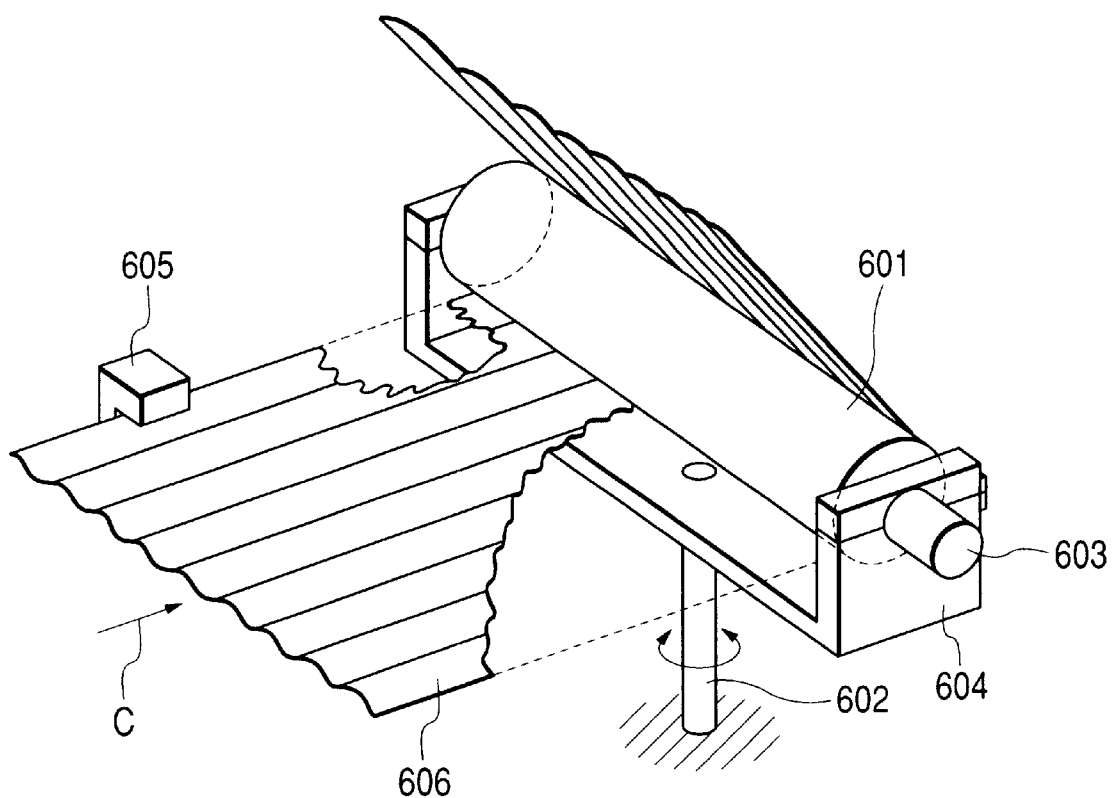
FIG. 6 illustrates a steering mechanism in a roll-to-roll treatment apparatus.

The external stress is explained below. The roll-to-roll treatment apparatuses for the back reflection layer, the semiconductor layer, and the transparent electroconductive layer have respectively a steering mechanism as shown in FIG. 6, as the mechanism for arranging orderly the edge face of the wound substrate in winding-up. In FIG. 6, the numeral 601 indicates a steering roller, 602 a turning mechanism, 603 an encoder for detecting the delivery speed, 604 a bearing, 605 a detector for detecting lateral deviation of the substrate, and 606 a substrate. The substrate is delivered in the direction shown by the arrow C. Driving and stopping of the steering mechanism causes difference of stress in the breadth direction of the substrate, so that repetition of the driving and stopping of the steering mechanism affects deformation of the edge waviness. The greater stress enlarges the edge waviness more.

In this embodiment, enlargement of the edge waviness of the electeroconductive belt-shaped substrate, which could enlarge the deformation stresses such as thermal deformation stress, deposition film stress, and external stress in the roll-to-roll type treatment apparatuses, is prevented by controlling systematically the tensile force and the substrate temperature of the respective treatment steps. Even if the edge waviness deformation may be caused, the adverse effects thereof can be minimized by the control to prevent the scratching of the formed film face or instability of discharge by leakage in the later treatment steps.

In this embodiment, the tensile force, and the substrate temperature are controlled for preventing the aforementioned edge waviness deformation.

Figure 8:
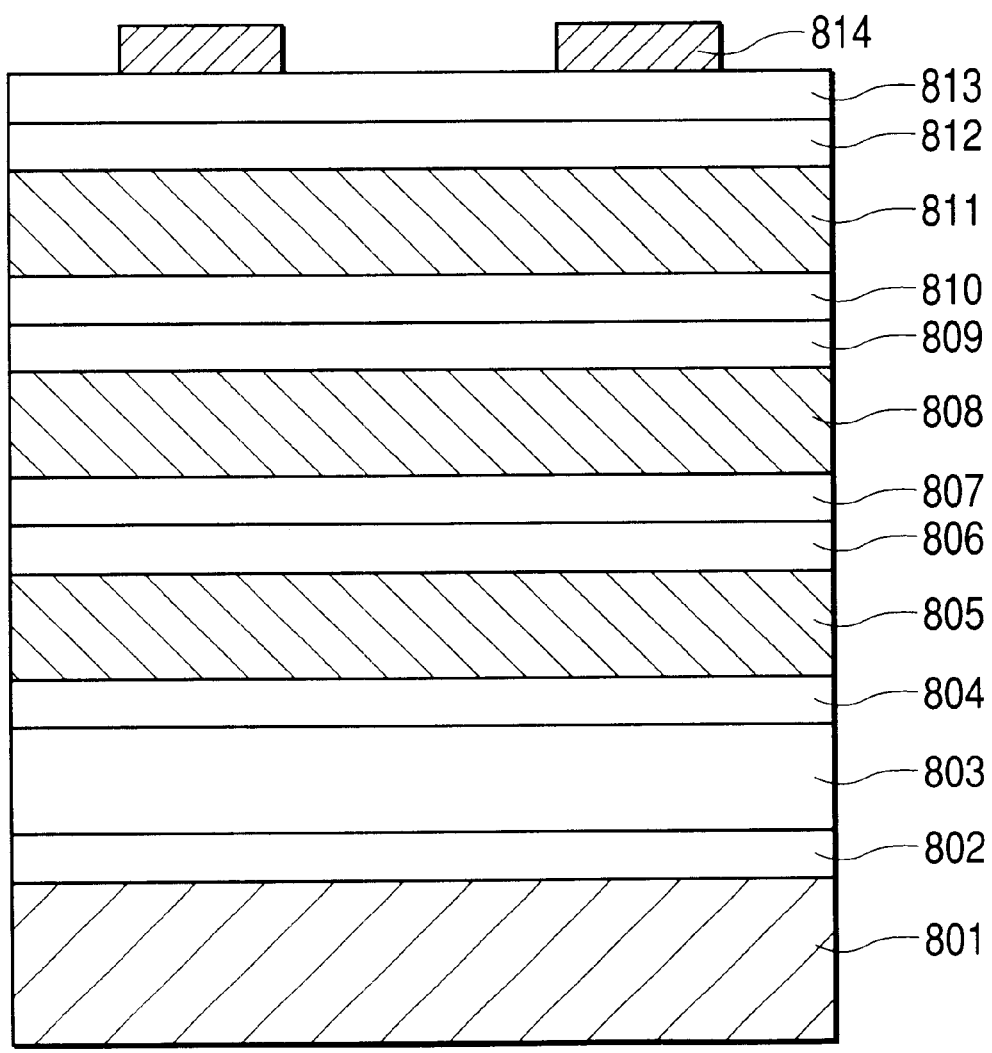
FIG. 8 is a schematic sectional view illustrating a constitution of a triple type a-Si solar cell.

As one embodiment, the constitution shown in FIG. 8 is explained. In the respective steps, the tensile force and the substrate temperature are controlled.

Firstly in the cleaning step, an uncleaned belt-shaped electroconductive substrate is introduced into a roll-to-roll type of cleaning apparatus not shown in the drawing, and the tensile force is adjusted so as not to cause loosening of the substrate. The substrate is degreased and cleaned sufficiently in a cleaning tank containing an alkali detergent or a surfactant, and a rinse tank. In this cleaning step, the temperatures of the solutions in the tanks range from room temperature to 100° C., so that the expansion of the substrate is relatively small. Since the cleaning is conducted in the initial stage of the entire treatment process, the unnecessarily strong tensile force applied to the substrate will increase the deformation of the substrate, which may affect adversely the later steps. Therefore the tensile force applied in the cleaning step ranges preferably from 300 to 500 N.

In the subsequent step of back reflection layer formation, cleaned belt-shaped electroconductive substrate 801 is introduced into a roll-to-roll type DC magnetron sputtering apparatus not shown in the drawing with adjustment of the tensile force not to cause loosening of the substrate. Thereon, back reflection layers 802, 803 are formed by deposition of Al, and ZnO. The film formation temperatures range from 40 to 400° C. In this temperature range, the substrate is more extendible in this step than in the cleaning step. Therefore, if any edge waviness is caused in the preceding cleaning step, the adverse effect of the edge waviness can be canceled by applying a tensile force to extend slightly the substrate in this step. However, excessive tensile force application can enlarge the edge waviness in the steps after this back reflection layer formation. Moreover, a larger difference of the tension in this step from that in the cleaning step may cause slipping or tightening in winding of the substrate on application of the tensile force to cause scratching of the substrate.

Moreover the excessive tension impairs the matching of the film stress of the back reflection layer itself formed on the substrate to the elongation of the substrate and to the shrinkage of the substrate at the lower substrate temperature after the back reflection layer formation step. Depending on the extent of the tensile stress, the adhesiveness of the film may be lowered, cracks may be formed in the film, or the film may exfoliate. Therefore, to adapt the deposition film to the previous and subsequent steps, the tensile force applied to the substrate in the back reflection layer formation ranges preferably from 450 to 700 N, and the difference of the tension from that of the previous cleaning step ranges preferably from 50 to 200 N.

In the subsequent semiconductor layer formation step, the substrate is set in a roll-to-roll type plasma CVD apparatus which is a combination of three sets of roll-to-roll type plasma CVD apparatuses shown in FIG. 2 by application of tensile force not to loosen the substrate. Then the following layers are deposited in lamination successively on the aforementioned back reflection layer: RF n-type layer 804 composed of a-Si, MW i-type layer 805 composed of a-SiGe, and RF p-type layer 806 composed of $\mu$c-Si (bottom layers); RF n-type layer 807 composed of a-Si, MW i-type layer 808 composed of a-SiGe, and RF p-type layer 809 composed of $\mu$c-Si (middle layers); and RF n-type layer 810 composed of a-Si, RF i-type layer 811 composed of a-Si, and RF p-type layer 812 composed of $\mu$c-Si (top layers). That is, the semiconductor layer is composed of a triple cell constituted of three sets of a-Si/a-SiGe/a-SiGe layers. The film formation temperature is in the range from 150 to 400° C., so that the substrate is extendible similarly as in the back reflection layer formation step.

Therefore, similarly as in the control of the tensile force in the aforementioned back reflection layer formation step, a greater tensile force than in the back reflection layer is applied to the substrate in this semiconductor formation step. Thereby if some edge waviness is formed in the preceding back reflection layer formation step, the influence of the edge waviness can be canceled. However, application of excessive tensile force causes edge waviness in the semiconductor layer formation step. Moreover, a larger difference of the tensile force between this step and the previous back reflection layer formation step may cause slipping or tightening in winding of the substrate on application of the tensile force to cause scratching of the substrate.

Moreover the excessive tensile force applied impairs the matching of the film stress of the semiconductor layer itself to the substrate and the back reflection layer, and the matching thereof to the shrinkage of the substrate at the lower substrate temperature after the semiconductor layer formation step. Depending on the strength of the tensile force, the adhesiveness of the film may be lowered, cracks may be formed in the film, or the film may exfoliate. The excessive tensile force applied may affect adversely the film structure to deteriorate the film quality. Therefore, to adapt the deposition film to the previous and subsequent steps, the tensile force applied in the semiconductor layer formation ranges preferably from 650 to 800 N, and the difference of the tension from that of the previous back reflection layer formation step ranges preferably from 50 to 200 N.

The stepwise control of the tensile force in the respective steps (tapered tension) is explained below.

The stepwise control of the tensile force applied to the substrate in the respective steps (tapered tension) increase further the effect of the present invention. In particular, in a long substrate delivery, the delivery of the substrate with a constant tensile force in the step may cause slipping or irregular winding of the substrate.

This disadvantage can be lessened by changing the tension of the substrate stepwise from initial stage to the final stage. Specifically, from the initial stage (beginning) of the winding to the final stage (end) of the winding, the tensile force applied to the substrate is continuously or stepwise decreased. The tensile force in the final stage is controlled in the present invention in the range preferably from 95% to 50%, more preferably from 90% to 60%, still more preferably from 85% to 70% of the tensile strength of the initial stage.

The present invention is described more specifically regarding a formation of a thin film solar cell by reference to examples and a comparative example without limiting the invention in any way.

EXAMPLE 1

In this Example 1 of the present invention, an amorphous solar cell was prepared by the roll-to-roll treatment process of the present invention.

FIG. 8 is a schematic sectional view illustrating a constitution of a triple type a-Si solar cell. In FIG. 8, the solar cell is constituted of a substrate 801, back reflection layers 802 to 803, semiconductor layers 804 to 812, a transparent electroconductive layer 813, and collecting electrodes 814. Hereinafter the assembly of the parts 801–813 is called a solar cell slab (or simply, a slab).

In the cleaning step, an uncleaned belt-shaped electroconductive stainless steel substrate (SUS4302D, 360 mm in breadth, 0.15 mm in thickness, and 1100 mm in length) was introduced into a roll-to-roll type of cleaning apparatus not shown in the drawing. The substrate was passed through a cleaning tank containing an alkali detergent and a surfactant kept at 90° C. and a rinse tank kept at 60° C. by applying tensile force of 500 N in the delivery direction at a delivery speed of 2000 mm/min to be degreased and cleaned sufficiently.

In the subsequent step of back reflection layer formation, cleaned belt-shaped stainless substrate 801 was introduced into a roll-to-roll type DC magnetron sputtering apparatus not shown in the drawing by applying tensile force of 650 N in the delivery direction at a delivery speed of 1300 mm/min. In this step, Al was deposited in a thickness of 200 nm, and ZnO was deposited in a thickness of 2000 nm as back reflection layers 802, 803. The film formation temperature was kept at 200° C.

In the subsequent semiconductor layer formation step, the substrate was set in a roll-to-roll type plasma CVD apparatus which is a combination of three sets of roll-to-roll type plasma CVD apparatuses shown in FIG. 2. The substrate was delivered by application of tensile force of 800 N in the delivery direction at a delivery speed of 1300 mm/mm. Thereby the following layers were deposited in lamination successively on the aforementioned back reflection layer: RF n-type layer 804 composed of a-Si, MW i-type layer 805 composed of a-SiGe, and RF p-type layer 806 composed of $\mu$c-Si (bottom layers); RF n-type layer 807 composed of a-Si, MW i-type layer 808 composed of a-SiGe, and RF p-type layer 809 composed of $\mu$c-Si (middle layers); and RF n-type layer 810 composed of a-Si, RF i-type layer 811 composed of a-Si, and RF p-type layer 812 composed of $\mu$c-Si (top layers). That is, the semiconductor layer was a triple cell of three sets of a-Si/a-SiGe/a-SiGe layers. The film formation temperature was controlled to be at 350° C.

In the subsequent step of transparent electroconductive layer formation, the substrate was set in a roll-to-roll type DC magnetron sputtering apparatus. In this apparatus, transparent electroconductive layer 813 was formed by depositing ITO in a thickness of 85 nm on the above formed semiconductor layer.

By the above operation, an a-Si/a-SiGe/a-SiGe triple type solar cell was completed.

In the subsequent step of slab cutting, the a-Si/a-SiGe/a-SiGe triple type solar cell was cut by a slab cutter not shown in the drawing into slabs in a size of 360 mm×240 mm (240 mm in the substrate delivery direction with the width 360 mm kept unchanged).

In the subsequent step of modularization, the cut slabs were delivered into a solar cell modularizing process line for modularization treatment such as etching and electrolytic treatment, and thereon forty-two collecting electrodes 814 were soldered at intervals of 5.6 mm.

Through the above steps, a-Si/a-SiGe/a-SiGe triple type of thin film solar cells were prepared.

Figure 7:
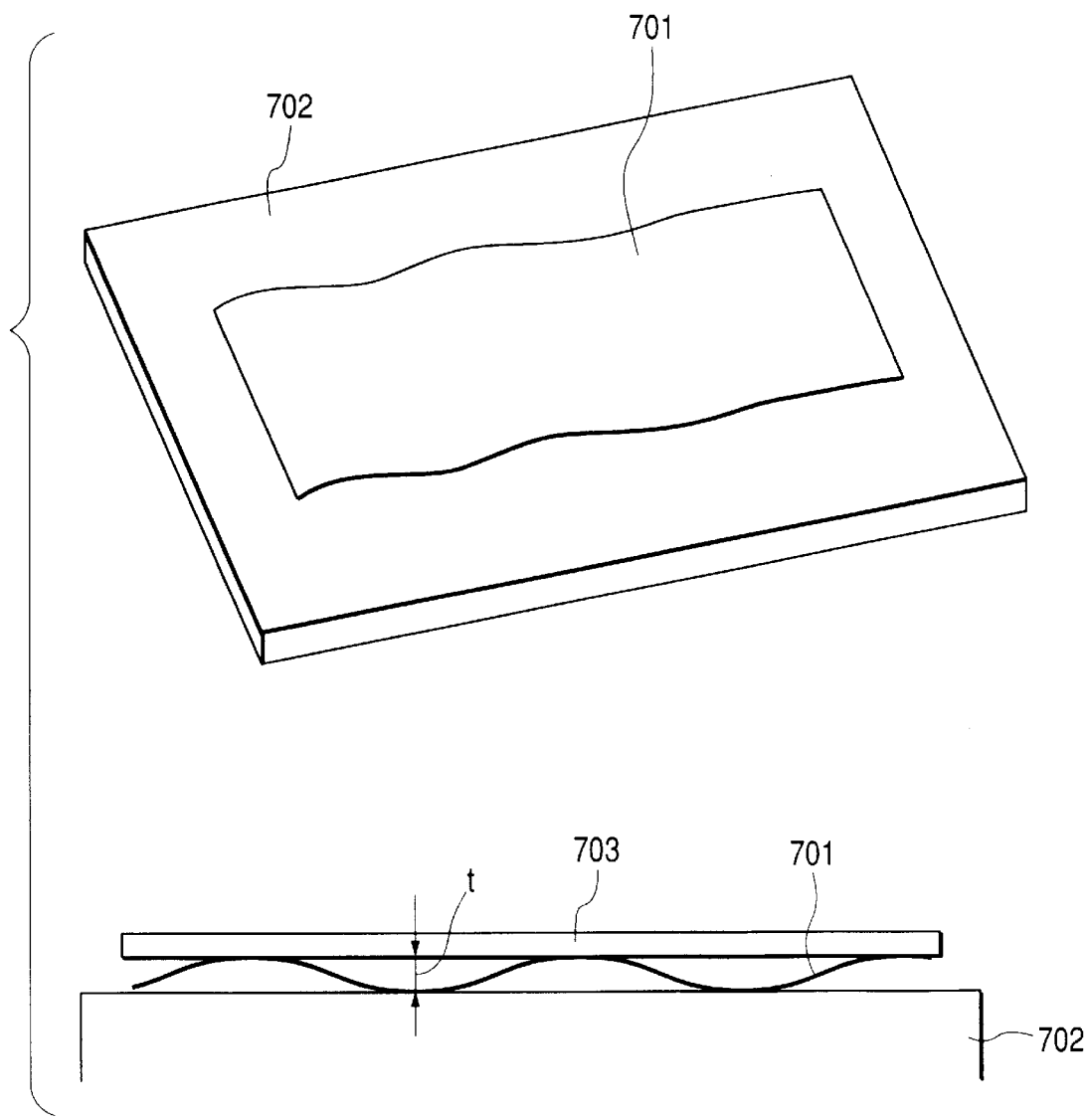
FIG. 7 illustrates schematically a belt-shaped substrate having edge waviness.

For evaluation, samples were cut out from the substrate in a breadth of 2 m after the cleaning step, the back reflection layer formation step, and the semiconductor layer formation step, respectively. The cut substrate sample was placed on a surface plate with the film side directed upward as shown in FIG. 7. A ruler was brought into contact with the peaks of the substrate, and the largest wave height t was measured as the index of the edge waviness. Separately, the finished thin film solar cell was evaluated for photoelectric conversion efficiency with a simulated sunlight of AM1.5 in light quantity of 100 mW/cm$^2$. The production yield was evaluated by frequency of discharge interruption, and visual observation of the scratch on the formed film face, in 10-hour continuous formation of the semiconductor layer by the plasma CVD apparatus.

As the results, the edge waviness was 0.7 mm after the cleaning step, 1.5 mm after the back reflection layer formation step, and 2.5 mm after the semiconductor formation step. The photoelectric conversion efficiency was 9.8%. The discharge interruption occurred five times. The surface scratch was not observed. Thus, the thin film solar cell of the present invention was found to have satisfactory properties and to be produced in a satisfactory yield.

EXAMPLE 2

In this Example 2, the thin film solar cells were produced in the same manner as in Example 1 except that the tensile force was decreased as from 500 to 350 N in the cleaning step, from 650 to 500 N in the back reflection layer formation step, and from 800 to 700 N in the semiconductor formation step. The evaluation was conducted in the same manner as in Example 1.

As the results, the edge waviness was 0.5 mm after the cleaning step, 1.2 mm after the back reflection layer formation step, and 2.1 mm after the semiconductor formation step. The photoelectric conversion efficiency was 9.8%. The discharge interruption occurred six times. The surface scratch was not observed. Thus, the thin film solar cell of the present invention was found to have satisfactory properties and to be produced in a satisfactory yield similarly as in Example 1.

Comparative Example

In this Comparative Example, the thin film solar cells were produced in the same manner as in Example 1 except that the tensile force was controlled to be at 800 N in the cleaning step, 700 N in the back reflection layer formation step, and 800 N in the semiconductor formation step. The evaluation was conducted in the same manner as in Example 1.

As the results, the edge waviness was 1.5 mm after the cleaning step, 2.5 mm after the back reflection layer formation step, and 3.7 mm after the semiconductor formation step. The photovoltaic conversion efficiency was 9.6%. The discharge interruption occurred 25 times. Many surface scratches were observed.

Tables 2 and 3 summarizes the results.

TABLE 2

Edge waviness

|  | After cleaning/mm | After back reflection layer formation/mm | After semiconductor layer formation/mm |
|---|---|---|---|
| Example 1 | 0.7 | 1.5 | 2.5 |
| Example 2 | 0.5 | 1.2 | 2.1 |
| Comparative Example | 1.5 | 2.5 | 3.8 |

TABLE 3

|  | Photoelectric conversion efficiency (%) | Times of discharge interruption | Visual examination of scratches |
|---|---|---|---|
| Example 1 | 9.8 | 5 | no scratch |
| Example 2 | 9.8 | 6 | no scratch |
| Comparative Example | 9.6 | 25 | many scratches |

As described above, according to the present invention, in a roll-to-roll type of substrate treatment apparatus, growth of edge waviness of a belt-shaped substrate can be prevented after passage of the belt-shaped substrate through plural roll-to-roll treatment steps, or even if some edge waviness has been caused, and thus the adverse effect of the edge waviness in the later steps can be suppressed. Thereby, the electric discharge can be maintained stably without occurrence of discharge interruption, and a deposition film can be formed with a uniform film thickness. Thus the present invention enables production of thin-film solar cells with a high production yield with excellent appearance of the solar cell.

What is claimed is:

1. A substrate treatment process, comprising:

a plurality of delivery steps of delivering a long substrate with application of tensile force to the substrate, with each delivery step initiating with unwinding of the long substrate from a first roll and concluding with winding of the long substrate on a second roll; and changing the tensile force at least between a first delivery step and a second delivery step.

2. The substrate treatment process according to claim 1, wherein the tensile force is less in the first delivery step than in the second delivery step.

3. The substrate treatment process according to claim 1, wherein extensibility of the substrate in the first step is equal to or higher than that in the second step.

4. The substrate treatment process according to claim 1, wherein temperature of the substrate in the first step is controlled to be not lower than 40° C.

5. The substrate treatment process according to claim 1, wherein the tensile force in the first step ranges from 300 to 800 N.

6. The substrate treatment process according to claim 1, wherein the difference in the tensile strength between the first step and the second step ranges from 50 to 200 N.

7. The substrate treatment process according to claim 1, wherein the tensile force is applied stepwise in the first step and/or the second step.

8. A substrate treatment process, comprising:

plural steps of delivering a long substrate with application of tensile force to the substrate; and changing the tensile force at least between a first delivery step and a second delivery step, wherein the first delivery step is a cleaning step and the second delivery step is a back reflection layer formation step.

9. A substrate treatment process, comprising:

plural steps of delivering a long substrate with application of tensile force to the substrate; and changing the tensile force at least between a first delivery step and a second delivery step, wherein the first delivery step is a back reflection layer formation step and the second delivery step is a semiconductor layer formation step.

* * * * *

UNITED STATES PATENT AND TRADEMARK OFFICE
CERTIFICATE OF CORRECTION

PATENT NO. : 6,694,792 B2
DATED : February 24, 2004
INVENTOR(S) : Masatoshi Tanaka et al.

It is certified that error appears in the above-identified patent and that said Letters Patent is hereby corrected as shown below:

<u>Title page,</u>
Item [*] Notice, should read -- Subject to any disclaimer, the term of this patent is extended or adjusted under 35 U.S.C. 154(b) by 51 days. --

<u>Column 1,</u>
Line 29, "a-si" should read -- a-Si --.

<u>Column 9,</u>
Line 48, "1300 mm/mm." should read -- 1300 mm/min --.

<u>Column 10,</u>
Line 42, "as from" should read -- from --.

Signed and Sealed this

Nineteenth Day of April, 2005

JON W. DUDAS
*Director of the United States Patent and Trademark Office*